United States Patent [19]

Moore

[11] Patent Number: 4,491,679

[45] Date of Patent: Jan. 1, 1985

[54] THERMOELECTRIC MATERIALS AND DEVICES MADE THEREWITH

[75] Inventor: Diane E. Moore, Clawson, Mich.

[73] Assignee: Energy Conversion Devices, Inc., Troy, Mich.

[21] Appl. No.: 516,153

[22] Filed: Jul. 21, 1983

[51] Int. Cl.³ .............................................. H01L 35/28
[52] U.S. Cl. .................................... 136/203; 136/205; 136/239; 136/240; 357/11; 420/501; 420/572; 420/577
[58] Field of Search ............... 136/203, 205, 239, 240; 357/11; 420/501, 572, 577

[56] References Cited

U.S. PATENT DOCUMENTS

| | | | |
|---|---|---|---|
| 3,485,757 | 12/1969 | Shapiro | 136/239 X |
| 3,695,867 | 10/1972 | Skrabek et al. | 136/239 X |
| 3,902,923 | 9/1975 | Evans et al. | 136/203 |
| 3,956,017 | 5/1976 | Shigemasa | 136/206 X |

OTHER PUBLICATIONS

F. D. Rosi, et al., Materials for Thermoelectric Refrigeration, Jan. 1959, pp. 191-200, vol. 10.
T. Durst, et al., Production of Alloys of Bismuth Telluride for Solar Thermoelectric Generators, 1981, pp. 181-186.
G. N. Gordiakova, et al., Investigation of Thermoelectric Properties of Solid Solutions $Bi_2Te_3$–$Bi_2Se_3$, Jan. 1959, pp. 1-14.

*Primary Examiner*—Leland A. Sebastian
*Attorney, Agent, or Firm*—Richard M. Goldman

[57] ABSTRACT

The disclosed invention includes improved devices and materials for thermoelectric conversion, particularly for operation at temperatures of 300° C. and below. Disordered p-type semiconductor elements incorporate compound adjuvants of silver and lead to achieve enhanced "figure of merit" values and corresponding increased efficiencies of thermoelectric conversion. Similar results are obtained with disordered n-type elements by employing lowered selenium contents, preferably in combination with cuprous bromide.

Improved conversion devices include powder pressed elements from one or both of these materials.

14 Claims, No Drawings

THERMOELECTRIC MATERIALS AND DEVICES MADE THEREWITH

BACKGROUND

The present invention relates to new and improved materials for thermoelectric applications and devices made therewith.

It has been recognized that the world supply of fossil fuels for the production of energy is being exhausted at ever increasing rates. This realization has resulted in an energy crisis which impacts not only the world's economy, but threatens the peace and stability of the world. The solution to the energy crisis lies in the development of new fuels and in more efficient techniques for energy conversion which avoid the dependence on fossil fuels.

An important part of the solution with respect to the development of permanent, economical energy conversion lies in the field of thermoelectrics wherein electrical power is generated by heat and where, via the Peltier effect, a temperature gradient may be generated from electric power to accomplish heating or cooling.

The performance of a thermoelectric device can be expressed in terms of a figure of merit (Z) for the material forming the device, wherein Z is defined as:

$$Z = \frac{S^2 \sigma}{K}$$

where:
Z is expressed in units $\times 10^3/°K$.
S is the Seebeck coefficient in $\mu V/°C$.
K is the thermal conductivity in $mW/cm-°K$.
$\sigma$ is the electrical conductivity in $(\Omega cm)^{-1}$ From the above, one can see that in order for a material to have a high figure of merit, it must have a relatively large value for the Seebeck coefficient (S), a high electrical conductivity ($\sigma$), and a low thermal conductivity (K). Further, there are two components to the thermal conductivity (K): $K_l$, the lattice component; and $K_e$, the electrical component. In non-metals and semiconductors, $K_l$ dominates and it is this component which mainly determines the value of K.

Stated in another way, in order for a material to be efficient for thermoelectric conversion, it is important to allow charge carriers to diffuse easily from the hot junction to the cold junction while maintaining the temperature gradient. Hence, high electrical conductivity is required along with low thermal conductivity.

Thermoelectric conversion has not found wide usage in the past. The major reason for this is that prior art thermoelectric materials which have been proposed for commercial applications have been primarily crystalline in structure. Those crystalline materials best suited for thermoelectric devices are very difficult to manufacture because of poor mechanical properties and sensitivity of material porperties to compositional changes. This results because they contain a predominance of elements, such as tellurium, and selenium, which are natural glass formers. The growth, control, and mechanical stability of these crystals have, therefore, led to what to this date are insurmountable problems. In particular, materials having a high figure of merit are generally made from chalcogenides such as tellurium compounds which are notorious for the difficulties in growth of high-quality single crystals. Even when such crystals are grown, they contain large densities of defects and are often unstable. In addition, they usually are far from stoichiometric. For all of these reasons, controlled doping has proven to be extremely difficult.

Crystalline solids cannot attain large values of electrical conductivity while maintaining low thermal conductivity. Most importantly, because of crystalline symmetry, thermal conductivity cannot be independently controlled by modification.

In the case of the polycrystalline approach, the problems of single crystalline materials still dominate. However, new problems are also encountered by virtue of the polycrystalline grain boundaries which cause these materials to have relatively low electrical conductivities. In addition, the fabrication of these materials is also difficult to control as a result of their more complex crystalline structure. The chemical modification or doping of these materials, because of the above problems is especially difficult.

Among the best known currently existing polycrystalline thermoelectric materials are those based on $Bi_2Te_3$, Pb-Te, and Si-Ge. The Si-Ge materials are best suited for high temperature applications in the 600° to 1000° C. range with a satisfactory Z appearing at above 700° C. The PbTe polycrystalline material exhibits its best figure of merit in the 300° to 500° C. range. Neither of these materials is well suited for applications below 300° C. This is indeed unfortunate, because it is in this temperature range where a wide variety of applications are found.

Extensive efforts have been made to improve the figure-of-merit for bismuth telluride systems for temperatures ranging from 300° C. and downward. Variations have been suggested in materials (e.g. alloying components and dopants), morphology (crystalline or disordered (amorphous, microcrystalline, polycrystalline)) production technique (crystal growth, quenching, powder pressing, annealing, sintering, etc.), and in other variables.

Disordered materials are ideally suited for manipulation since they are not constrained by the symmetry of a single phase crystalline lattice or by stoichiometry. By moving away from materials having such restrictive single phase crystalline symmetry, it is possible to accomplish a significant alteration of the local structural and chemical environments involved in thermoelectric conversion efficiency.

The types of disordered structures which provide the local structural chemical environments for the enhanced efficiency contemplated by the invention include many types. The following list provides a classification of the spectrum of disordered structures contemplated by the present invention:

1. Multicomponent polycrystalline materials lacking long-range compositional order.
2. Microcrystalline materials.
3. Mixtures of polycrystalline and microcrystalline phases.
4. Mixtures of polycrystalline or microcrystalline and amorphous phases.
5. Amorphous materials containing one or more amorphous phases.

Disordered thermoelectric materials are fully disclosed in copending U.S. application Ser. No. 412,306, filed Aug. 25, 1982 now U.S. Pat. No. 4,447,277 in the names of Tumkur S. Jayadev and On Van Nguyen for "New Multiphase Thermoelectric Alloys and Method of Making Same", and in copending U.S. Ser. No. 414,917 filed Sept. 3, 1982 by Jayadev et. al. entitled "New Powder Pressed Thermoelectric Materials And Method of Making Same." both of which are incorporated herein by reference. Materials of this type are good thermal insulators.

Amorphous materials, representing the highest degree of disorder, have been made for thermoelectric applications. The materials and methods for making the same are fully disclosed and claimed, for example, in U.S. Pat. Nos. 4,177,473, 4,177,474, and 4,178,415 which issued in the name of Stanford R. Ovshinsky. The materials disclosed in these patents are formed in a solid amorphous host matrix having structural configurations which have local rather than long range order and electronic configurations which have an energy gap and an electrical activation energy. Added to the amorphous host matrix is a modifier material having orbitals which interact with the amorphous host matrix as well as themselves to form electronic states in the energy gap.

Alloy and dopant materials have been suggested for use with various thermoelectric materials but generally those adjuvants useful for one system cannot be used with the same beneficial results in systems of different composition or morphology.

In "Materials for Thermoelectric Refrigeration" *J. Physical Chemistry* V.10 Pp. 191-200 (1959) adjuvants are suggested for crystalline p- and n-type materials. Suggested for p-type are all elements in Groups IV and V such as Sn, Pb, Sb, As and excess Bi. For n-type, Cu₂S and the iodides and bromides of copper and silver are suggested for the optimum system containing 15 to 25% Bi₂Se₃ in crystalline form. Other publications suggest additions for n-types including tellurium iodide, silver/antimony/tellurium, cuprous bromide, sulfur and elemental copper.

Alloys or dopants effective in a given system, aren't necessarily useful in other systems of differing components and/or morphology. For example, tellurium iodide, silver/antimony/tellurium, cuprous bromide, sulfur and elemental copper have proven ineffective in the present invention through apparently useful with prior materials.

The use of pressed powder materials as thermoelectric elements has been suggested, for example, in copending U.S. application Ser. No. 414,917 filed Sept. 3, 1982 in the names of Jayadev et. al. previously mentioned wherein a multiphase material based on bismuth and tellurium including a highly conductive second phase is pressed to form a thermoelectric element.

The materials of the present invention are also based on bismuth and tellurium and are powder pressed to form thermoelectric elements. The materials are more simply prepared than in the above process and incorporate alloy concentrations and/or dopants to form improved thermoelements. The thermoelements of the invention exhibit improved properties for thermoelectric applications, particularly at temperatures of 300° C. and below and especially for cooling. This is the range of operation of most heating and cooling devices and many electrical generation applications.

SUMMARY OF THE INVENTION

The present invention provides new and improved disordered materials for thermoelectric applications. A novel p-type powder thermoelectric material is formed from a melt containing bismuth, antimony, tellurium silver and lead. Improved n-type powdered thermoelectric materials comprise bismuth, tellurium and selenium at selenium concentration levels below that previously employed for materials of this type. In a preferred embodiment, the n-type thermoelectric material also includes up to 2.8% of cuprous bromide as a dopant.

In a further embodiment of the invention, thermoelectric devices utilize the improved thermoelectric elements of the invention.

DETAILED DESCRIPTION OF THE INVENTION

The present invention provides materials for the manufacture of thermoelectric elements which exhibit improved "figures of merit" particularly at temperatures of 300° C. and below. These improved results are accomplished through the benefit of one or more improved features of the materials including modification of alloy constitutent concentrations, inclusion of dopant materials in desired concentrations, and the selection of disordered structures as the morphology of the semiconductor material.

The p-type thermoelectric material comprises at least five components: bismuth, antimony, tellurium, silver and lead. The elements are prepared in a manner so that the components exhibit disordered structure.

In general the following formula may be applied with regard to the atomic percent of each component present in the thermoelectric element for the bismuth, antimony, silver, and tellurium components:

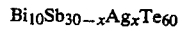

$$Bi_{10}Sb_{30-x}Ag_xTe_{60}$$

Values of X less than 0.1 atomic % are effective in the formulation. Preferably the silver content is from about 0.016 to about 0.05 atomic % and most preferably X has a value of about 0.02 atomic %. It is possible to adjust the formula to exchange bismuth for antimony/silver maintaining the total atomic % of Bi, Sb and Ag at about 40.

The lead content in the p-type thermoelectric elements may be effective at concentrations of up to about 1.0 wt.%. Minimum concentrations of 0.01 wt.% are generally desirable to achieve effective results. Preferably the lead content will be in the range of about 0.05 to 0.1 wt.% and most preferably will be about 0.065 to 0.075 wt.%.

The materials employed to prepare the thermoelectric elements should be of high purity so as to avoid the inadvertent inclusion of impurities which may alter adversely the properties of the resulting thermoelectric element. When both silver and lead are included in the bismuth-antimony-tellurium composition, it is found that there is a substantial increase in the Seebeck coefficient and the electrical conductivity without a corresponding increase in the thermal conductivity. Accordingly, the overall "figure of merit" increases relative to the compositions which do not contain the silver and lead components.

To prepare thermoelectric elements the desired mass of each of the elements is melted, for example in a quartz tube. The tube is evacuated to $10^{-5}$ torr and sealed. The tube is then placed in an oven. The resulting melt is agitated periodically and then removed and allowed to cool to room temperature to form an ingot. The ingot is then crushed and milled and the resulting powder is sieved to the desired size. The elements are then formed from the powder by the application of pressure which should be sufficient to result in elements having near maximum compression density for the particular formula (for p-type elements a density in the range of 5.5 to 6.5 g/cc.) The thus formed elements are then sintered in an inert atmosphere by exposure to peak temperatures of 375°–550° for 1–10 hours.

Typical thermoelectric element sizes are cross-sections of from $1 \times 1$ to $4 \times 4$ mm with a thickness of 0.75 mm and upward.

The n-type thermoelectric elements of the invention may be employed in conjunction with the p-type elements of the invention in an integral thermoelectric device. The n-type elements are similar to the p-type elements in being comprised of disordered or materials and being prepared in a pressed powder form. The n-type materials of the invention differ from those of the prior art in that the selenium alloy content is less than has been previously recognized as useful and in including cuprous bromide dopant in conjunction with the low selenium alloy content.

Extensive work on bismuth selenide and bismuth telluride alloys has resulted in the conclusion that for thermoelectric purposes the desired content of bismuth selenide is approximately 20 mol% in the alloy composition. This corresponds to a selenide content of approximately 12 atomic %. Concentrations of selemide below 6 atomic % have not been recommended. In accordance with the present invention, improved thermoelectric properties are obtained when in conjunction with the employment of disordered structures the alloy content is reduced to a level where less than 6 atomic % selenium is present in the thermoelectric material. Desirably the selenium content is at least 2% and preferably is about 4%. Most preferably the n-type thermoelectric material additionally included cuprous bromide. The cuprous bromide may be present in concentrations of from 0.005 to 2.0 wt.%. More preferably the cuprous bromide is present in a concentration of from 0.01 to 0.1 wt. % and most preferably is present in a concentration of about 0.03 wt.%.

The manufacturing technique for the n-type thermoelectric materials is similar to that for the p-type thermoelectric materials except for the fact that the n-type material is pressed to a typical density of 6.8–7.6 g/cc.

The elements produced by the foregoing techniques may be employed in any conventional thermoelectric conversion devices. Most common are the devices wherein the p- and n-type elements are connected thermally in parallel and electrically in series in order to either generate electricity from a thermal gradient or produce a thermal gradient as a result of current flow via the Peltier effect. Under these circumstances the p- and n-type elements of the invention may be employed alone or together in a single integral device to produce increased thermoelectric conversion efficiency as indicated by the improved values of the "figure of merit".

The following examples illustrate the invention but are not intended to place limitations on the invention.

EXAMPLE 1

A number of p-type elements were prepared in pressed powder form using conventional techniques. The components were melted, solidified, crushed, milled, sieved to 100 mesh and then formed into elements under pressure and subjected to sintering with temperatures rising to a peak of 400°–550° C. Densities of about 5.8 g/cc were obtained for p-type and about 7.3 g/cc for n-type elements. The Seebeck coefficient (S), electrical conductivity ($\sigma$) and maximum figure of merit (Z) and corresponding temperature were measured for the various compositions. Table I shows the results obtained when the indicated wt% Pb was included in preparing a material of approximate empirical formula:

$$Bi_{10}Sb_{30-x}Ag_xTe_{60}$$

TABLE I

| Test | X | Pb-(Wt %) | S ($\mu V/°C.$) | $\sigma$ ($\Omega\text{-cm})^{-1}$ | Max Z (at °C.) ($\times 10^3/°K.$) |
|---|---|---|---|---|---|
| 1A | 0 | .025 | 208 | 404 | 2.02 (20° C.) |
| 1B | 0 | .050 | 200 | 468 | 2.26 (20° C.) |
| 1C | 0 | .060 | 200 | 500 | 2.30 (48° C.) |
| 1D | .02 | .055 | 175 | 725 | 2.26 (47° C.) |
| 1E | .02 | .065 | 178 | 702 | 2.49 (48° C.) |
| 1F | .02 | .075 | 180 | 750 | 2.36 (22° C.) |
| 1G | .04 | .065 | 167 | 834 | 2.31 (75° C.) |
| 1H | .04 | .075 | 166 | 755 | 2.44 (70° C.) |
| 1I | .10 | .055 | 132 | 1,310 | 1.66 (97° C.) |
| 1J | .10 | .065 | 132 | 1,307 | 1.76 (95° C.) |

The results show that the conductivity and figure of merit may be increased by employing materials containing a partial substitution of silver for antimony in the basic bismuth/antimony/tellurium materials together with a lead dopant. Desired improvements in conductivity without a corresponding increase in thermal conductivity (as indicated by high Z values) are demonostrated. This data indicates best results obtained below 0.1 atomic % Ag with Pb concentrations of 0.075 wt.%.

When comparative tests are run on the same material without either Ag or Pb, maximum Z values below 1 are obtained.

EXAMPLE 2

A thermoelectric cooling device was manufactured using elements prepared by the above technique, each measuring $1.4 \times 1.4 \times 1$ mm. The device was connected electrically in series and thermally in parallel employing in alternating fashion 128 p-type and 128 n-type elements. The p-type element was that of Example 1E and the n-type was $Bi_{40}Te_{56}Se_4$. At 12 V, 6.5 amps, a temperature difference of 30° C. and cold side temperature of $-5°$ C. the device pumped 35 watts of heat where the elements were arranged to conduct electricity parallel to the direction of force application during pressing.

EXAMPLE 3

Using elements of the same composition and method of manufacture as Example 2 but with different orientation to current flow, element dimensions, temperature difference, cold side temperature and amperage, heat was pumped at rates of from 7 to 21.7 watts with a temperature gradient of from 22.3° to 53° C.

EXAMPLE 4

Using elements of the same composition similar devices were prepared and employed to produce electricity directly from a thermal gradient. Temperature gradients of approximately 200° C. (30° C. cold side) were maintained. Electricity was produced at a rate of from 7.6 to 12.4 W.

EXAMPLE 5

N-type thermoelectric elements were prepared in accordance with the above procedure from materials of empirical formula:

$$Bi_{40}Te_{60-x}Se_x$$

Table II shows the results obtained for different selenide levels.

TABLE II

| Test | X | S (μV/°K.) | σ (Ω cm)$^{-1}$ | Max Z (at °C.) (× 10$^3$/°C.) |
|---|---|---|---|---|
| A | 4 | −250 | 432 | 1.9 (22° C.) |
| B | 12 | −243 | 327 | 1.43 (22° C.) |

This example demonstrates that superior thermoelectric properties are exhibited in disordered n-type elements containing relatively small selenide contents compared to conventional Bi/Te/Se n-type materials.

EXAMPLE 6

N-type materials containing 4 and 6 atomic % selenide were doped with various quantities of CuBr. Table III gives the results of testing.

TABLE III

| Test | X | CuBr-% | S | σ | Max Z (at °C.) |
|---|---|---|---|---|---|
| 6A | 4 | .01 | −240 | 425 | 1.89 (24° C.) |
| 6B | 4 | .03 | −185 | 970 | 1.78 (78° C.) |
| 6C | 4 | .05 | −170 | 920 | 1.60 (71° C.) |
| 6D | 6 | .01 | −225 | 475 | 1.50 (76° C.) |

Where CuBr$_2$ and elemental copper were employed in the low selenide system comparable results were not obtained.

What is claimed is:

1. A p-type disordered thermoelectric material comprising bismuth, antimony, tellurium, silver and lead.

2. The material of claim 1 wherein said silver is present in a concentration of less than 0.1 atomic % based on the content of bismuth, antimony, tellurium and silver.

3. The material of claim 2 wherein said silver concentration is less than about 0.05 atomic %.

4. The material of claim 3 wherein said silver concentration is at least about 0.016 atomic %.

5. The material of claim 1 wherein said lead is present in a concentration of up to about 1.0 wt.%.

6. The material of claim 5 wherein said lead is present in a concentration of at least about 0.01 wt.%.

7. The material of claim 6 wherein said lead is present in a concentration of from about 0.05 to 0.1 wt.%.

8. The material of claim 7 wherein said lead is present in a concentration of about 0.065 to 0.075 wt.%.

9. The material of claim 1 wherein the atomic precentages of the bismuth, antimony, tellurium and silver maybe expressed by the formula:

$$Bi_{10}Sb_{30-x}Ag_xTe_{60}$$

wherein X is less than 0.10.

10. The material of claim 9 wherein x is between about 0.016 and 0.05.

11. The material of claim 10 wherein said lead is additionally present in a concentration less than 1.0 wt.%.

12. The material of claim 11 wherein said lead is present in a concentration of from about 0.05 to 0.1 wt.%.

13. The material of claim 12 wherein the lead content is about 0.065 to 0.075 wt.%.

14. In a thermoelectric device including both p-type and n-type semiconductor elements, the improvement comprising including at least one p-type element as described in claim 1.

* * * * *